(12) United States Patent
Yee et al.

(10) Patent No.: US 10,323,884 B2
(45) Date of Patent: Jun. 18, 2019

(54) HEAT EXCHANGER AND METHOD FOR MANUFACTURING SAME

(71) Applicants: LG ELECTRONICS INC., Seoul (KR); C3 CO., LTD., Ansan-si, Gyeonggi-do (KR)

(72) Inventors: Youngjoo Yee, Seoul (KR); Kyungkyoo Chang, Incheon (KR); Heeseok Jung, Hwaseong-si (KR); Chungguk Lee, Incheon (KR)

(73) Assignees: LG ELECTRONICS INC., Seoul (KR); C3 CO., LTD., Ansan-Si, Gyeonggi-Do (KR)

( * ) Notice: Subject to any disclaimer, the term of this patent is extended or adjusted under 35 U.S.C. 154(b) by 12 days.

(21) Appl. No.: 14/914,767

(22) PCT Filed: Jul. 31, 2014

(86) PCT No.: PCT/KR2014/007030
§ 371 (c)(1),
(2) Date: Feb. 26, 2016

(87) PCT Pub. No.: WO2015/034181
PCT Pub. Date: Mar. 12, 2015

(65) Prior Publication Data
US 2016/0209123 A1 Jul. 21, 2016

(30) Foreign Application Priority Data

Sep. 5, 2013 (KR) .................. 10-2013-0106721
May 22, 2014 (KR) .................. 10-2014-0061474

(51) Int. Cl.
*F28D 15/04* (2006.01)
*F28F 21/08* (2006.01)
(Continued)

(52) U.S. Cl.
CPC .............. *F28D 15/046* (2013.01); *B81C 1/00* (2013.01); *F28D 15/0233* (2013.01); *F28F 21/085* (2013.01); *B23P 15/26* (2013.01)

(58) Field of Classification Search
CPC .... F28D 15/046; F28D 15/0233; F28D 15/04; F28D 15/02
(Continued)

(56) References Cited

U.S. PATENT DOCUMENTS 4,015,659 A * 4/1977 Schladitz .............. F28D 15/046
165/104.26
6,460,612 B1 10/2002 Sehmbey et al.
(Continued)

FOREIGN PATENT DOCUMENTS

JP 2000-18854 A 1/2000
JP 2000-35292 A 2/2000
(Continued)

OTHER PUBLICATIONS

Ingram, Dendritic Wick for Heat Pipe Application, IBM Technical Disclosure, Feb. 1972.*

*Primary Examiner* — Eric S Ruppert
(74) *Attorney, Agent, or Firm* — Birch, Stewart, Kolasch & Birch, LLP (57) ABSTRACT

A heat exchanger according to the present invention comprises: a plate-shaped body having an interior space in which a working fluid is vaporized or condensed and flows; and a wick located within the body, the wick comprising a plurality of needle-shaped particles between which the working fluid flows. By forming a wick comprising needle-shaped particles, the heat exchanger according to the embodiments of the present invention can improve the porosity of the wick compared to conventional groove or mesh-shaped or sintered wicks. Accordingly, the working fluid is capable of flowing inside the wick more smoothly than in the conven- (Continued)

tional wicks, thereby improving a heat exchange rate or heat exchange performance.

9 Claims, 10 Drawing Sheets

(51) Int. Cl.
  *B81C 1/00* (2006.01)
  *F28D 15/02* (2006.01)
  *B23P 15/26* (2006.01)
(58) Field of Classification Search
  USPC .................................................. 165/104.26
  See application file for complete search history.

(56) References Cited

U.S. PATENT DOCUMENTS

| | | | | |
|---|---|---|---|---|
| 2004/0211549 | A1* | 10/2004 | Garner | F28D 15/0233 165/104.26 |
| 2006/0219391 | A1* | 10/2006 | Hong | F28D 15/046 165/104.26 |
| 2008/0225489 | A1* | 9/2008 | Cai | F28D 15/0266 361/704 |
| 2010/0200199 | A1* | 8/2010 | Habib | C25D 7/00 165/104.26 |
| 2011/0108142 | A1* | 5/2011 | Liu | H01L 23/427 137/561 R |
| 2011/0284188 | A1* | 11/2011 | Cai | F28D 15/0266 165/104.26 |
| 2013/0306274 | A1* | 11/2013 | Yang | F28D 15/02 165/104.21 |
| 2013/0306275 | A1* | 11/2013 | Yang | F28D 15/02 165/104.21 |

FOREIGN PATENT DOCUMENTS

| | | |
|---|---|---|
| KR | 2001-0003575 A | 1/2001 |
| KR | 2003-0068448 A | 8/2003 |
| KR | 10-2006-0008550 A | 1/2006 |
| KR | 10-0791854 B1 | 1/2008 |
| KR | 10-2013-0096045 A | 8/2013 |

* cited by examiner

HEAT EXCHANGER AND METHOD FOR MANUFACTURING SAME

TECHNICAL FIELD

The present invention relates to a heat exchanger and a manufacturing method thereof, and more particularly, to a heat exchanger which may improve the heat exchange efficiency, and a manufacturing method thereof.

BACKGROUND ART

In general, a heat pipe is used as a heat exchange means which effectively transfers heat without power even at a small temperature difference by using the latent heat of evaporation of a working fluid therein.

As disclosed even in Korean Patent No. 10-0791854, such a heat exchanger includes a body in which a vacuum state is established therein and a working fluid flows therein, and a wick provided on the inner wall of the body and having a capillary-like structure. The wick is generally formed of copper, and has a groove form, a mesh form, and a sintered form formed by sintering a copper powder. The aforementioned wicks with a groove form, a mesh form, and a sintered form are disadvantageous in a complicated process and high manufacturing costs. Further, when a heat exchanger having the wick with a groove form is left to stand in the same shape for a long period of time, there is a problem in that the inside of the heat exchanger becomes dry, and thus, heat transfer characteristics significantly deteriorate, and a wick with a sintered form has a disadvantage in that the work is carried out in the reducing atmosphere for a long period of time, and thus, the production costs are high. In addition, in the case of wicks with a sintered form and a mesh form, the structures are so compact that the porosity is low, and thus there is a disadvantage in that the working fluid does not smoothly flow.

DISCLOSURE OF THE INVENTION

Therefore, an object of the present invention is to provide a heat exchanger which may improve the heat exchange efficiency, and a manufacturing method thereof.

To achieve these and other advantages and in accordance with the purpose of the present invention, as embodied and broadly described herein, there is provided a thin-type heat exchanger and a manufacturing method thereof.

A heat exchanger according to the present invention includes: a body having an inner space in which a working fluid is vaporized or condensed, and thus capable of flowing; and a wick disposed within the body and having a plurality of needle-shaped particles, in which the working fluid flows among the plurality of needle-shaped particles.

The wick includes: a first layer formed by the growth of grains; and a second layer formed on the first layer and composed of a plurality of needle-shaped particles.

The body has a plate shape, a plurality of guide blocks is provided within the body, the plurality of guide blocks is disposed spaced apart from each other in a horizontal direction of the body, and a wick is formed in a space between the plurality of guide blocks.

The body includes: a base member having a plate shape; a cover member disposed on the base member spaced apart therefrom and having a plate shape; and a plurality of guide blocks disposed between the base member and the cover member, and disposed spaced apart from each other in a horizontal direction in a space between the base member and the cover member.

The body includes copper (Cu).

The first layer and the second layer include copper (Cu).

A method for manufacturing the heat exchanger includes: providing a base; forming a wick including a plurality of needle-shaped particles on the base; and installing a cover so as to cover the base and the wick.

The method includes: forming a groove so as to secure a space in which the wick is to be formed on the base before forming the wick on the base.

In the forming of the wick including a plurality of needle-shaped particles on the base, the wick is formed by using an electroplating method which supplies a pulse wave current.

In the forming of the wick including a plurality of needle-shaped particles on the base by using an electroplating method which supplies a pulse wave current, the forming of the wick includes: forming a first layer on the base due to the growth of grains by supplying direct current; forming a second layer composed of needle-shaped particles on the first layer by supplying a bipolar pulse wave current which periodically alternately supplies a forward direction current and a reverse direction current; and fixing the second layer on the first layer by supplying a unipolar pulse wave current which supplies the reverse direction current in a pulse form.

A current density of the reverse direction pulse wave and forward direction current pulse wave for forming the second layer are larger than a current density of the direct current wave for forming the first layer.

In the forming of the second layer by supplying the bipolar pulse wave current, a pulse output time of the reverse direction current is longer than a pulse output time of the forward direction current.

The base and the cover include copper (Cu).

In the forming of the first layer and the second layer, the first layer and the second layer are formed by providing an electrolytic copper plating solution to immerse the base in electrolytic copper plating solution and perform an electroplating.

In the heat exchanger according to exemplary embodiments of the present invention, the porosity of the wick may be improved by forming a wick including needle-shaped particles, as compared to the conventional wick with a groove, mesh or sintered form. Accordingly, since a working fluid flows within the wick more smoothly than in the related art, the heat exchange rate or the heat exchange performance is improved.

Furthermore, there is an advantage in that a thin-type heat exchanger may be manufactured by manufacturing a body having a plate shape, and a wick.

MODES FOR CARRYING OUT THE PREFERRED EMBODIMENTS

Reference will now be made in detail to the preferred embodiments of the present invention, examples of which are illustrated in the accompanying drawings. It will also be apparent to those skilled in the art that various modifications and variations can be made in the present invention without departing from the spirit or scope of the invention. Thus, it is intended that the present invention cover modifications and variations of this invention provided they come within the scope of the appended claims and their equivalents.

Description will now be given in detail of a drain device and a refrigerator having the same according to an embodiment, with reference to the accompanying drawings.

Hereinafter, exemplary embodiments of the present invention will be described in detail. However, the present invention is not limited to exemplary embodiments disclosed below, but may be implemented in various different forms. The exemplary embodiments are provided only to complete the disclosure of the present invention and fully convey the scope of the present invention to those having ordinary knowledge in the technical field, to which the present invention pertains.

Figure 1:
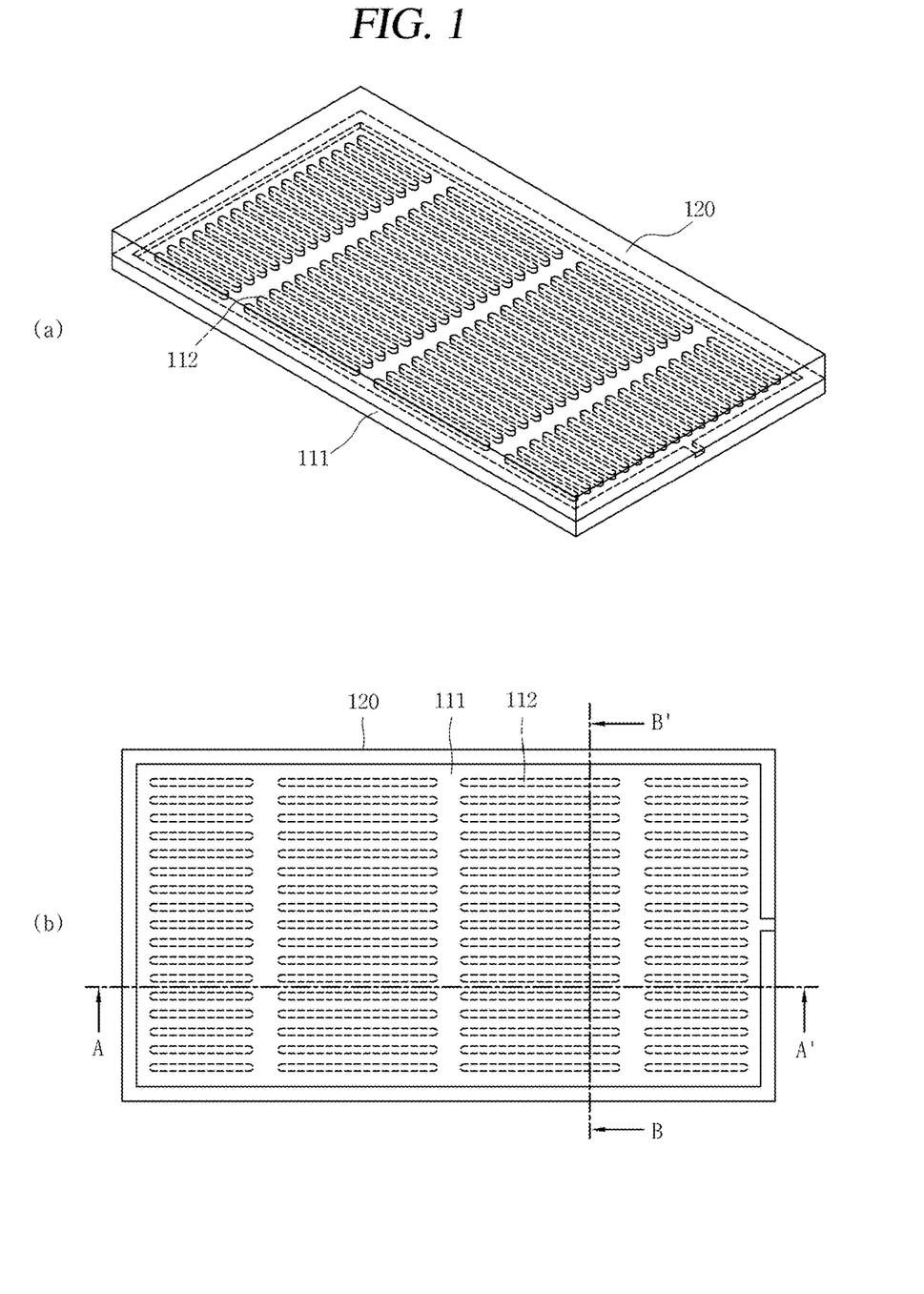
FIG. 1 is a 3D view illustrating a heat exchanger in which a plurality of wicks according to exemplary embodiments of the present invention is provided, and an exploded view illustrating a base, a plurality of wicks, and a cover, which are separated from each other.

FIG. 1 is a 3D view illustrating a heat exchanger in which a plurality of wicks according to exemplary embodiments of the present invention is provided, and an exploded view illustrating a base, a plurality of wicks, and a cover, which are separated from each other.

Figure 2:
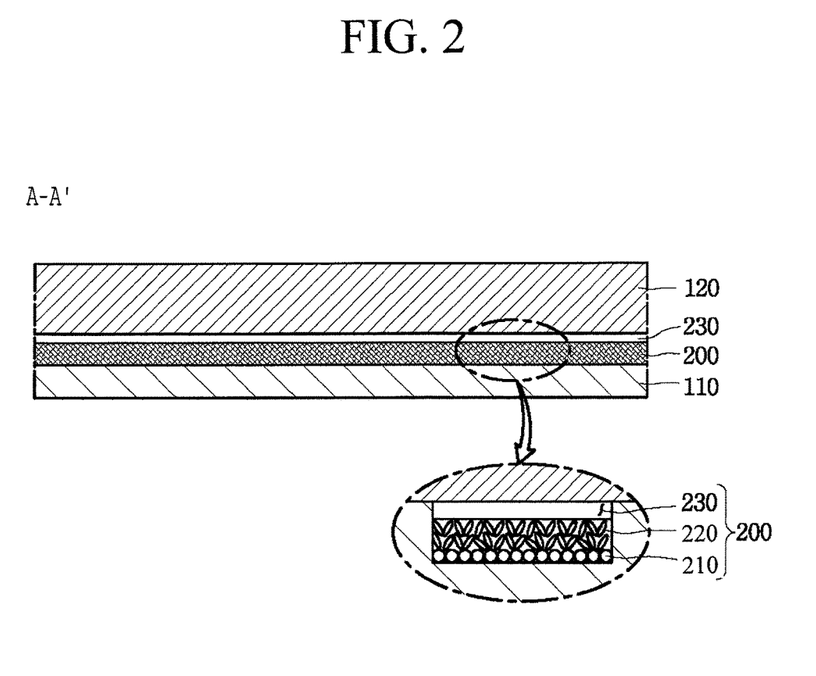
FIG. 2 is a cross-sectional view cut along A-A' of FIG. 1 as a cross-sectional view illustrating a heat exchanger according to a first exemplary embodiment of the present invention.
Figure 3:
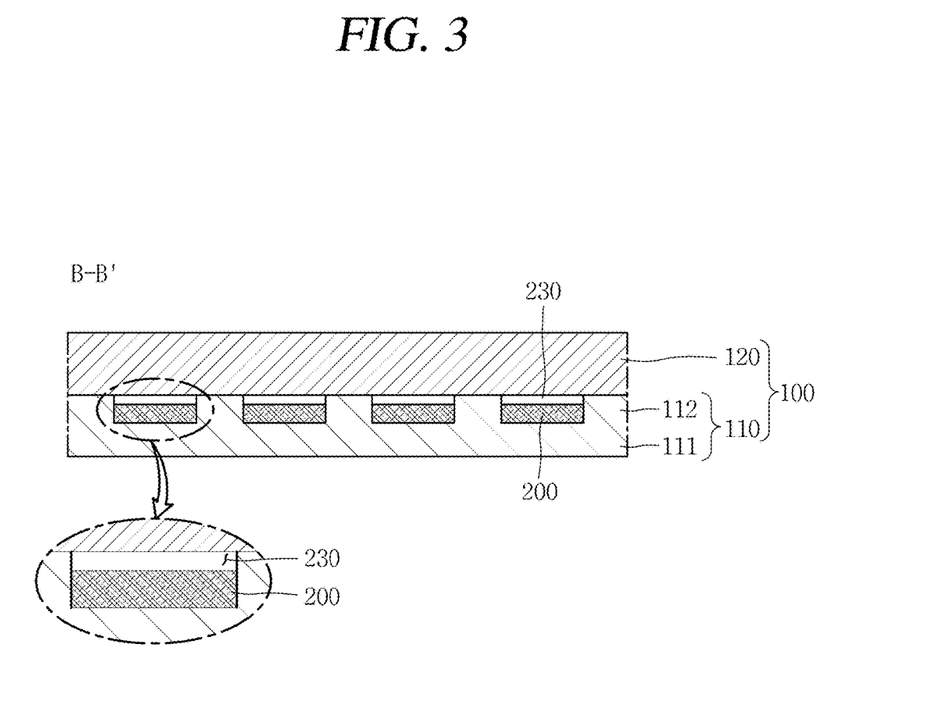
FIG. 3 is a cross-sectional view cut along B-B' of FIG. 1 as a cross-sectional view illustrating the heat exchanger according to the first exemplary embodiment of the present invention.
Figure 4:
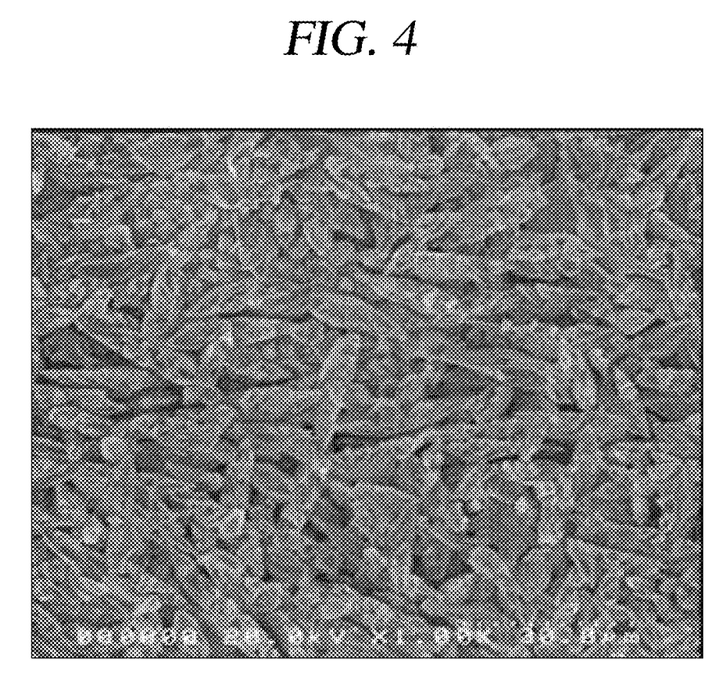
FIG. 4 is a magnified photograph illustrating a second layer including a plurality of needle-shaped particles.
Figure 5:
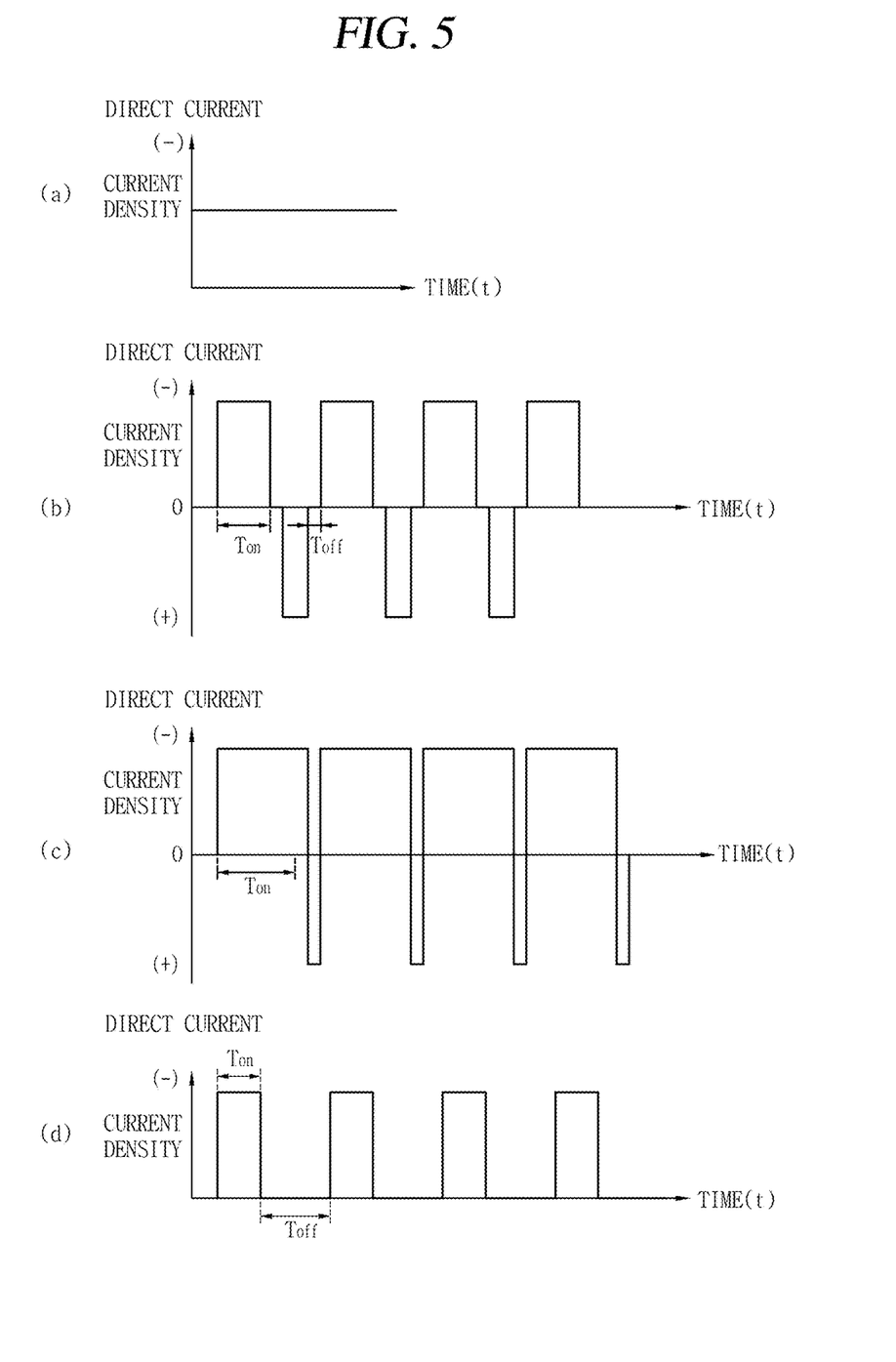
FIG. 5 is a view illustrating current waveforms used when wicks are formed in the present invention.
Figure 6:
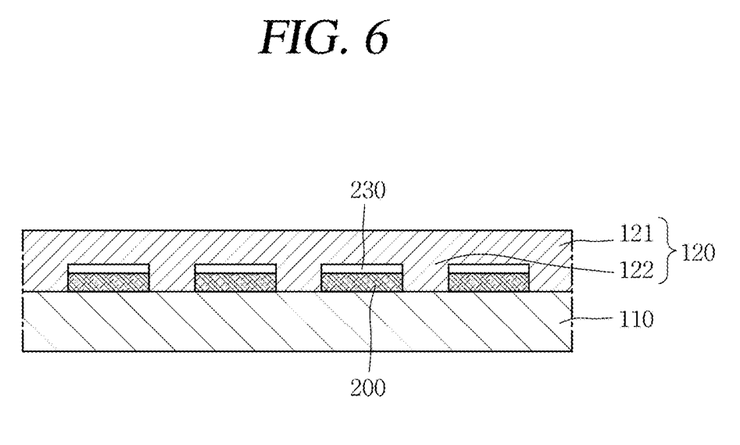
FIG. 6 is a cross-sectional view illustrating a heat exchanger according to a second exemplary embodiment of the present invention.
Figure 7:
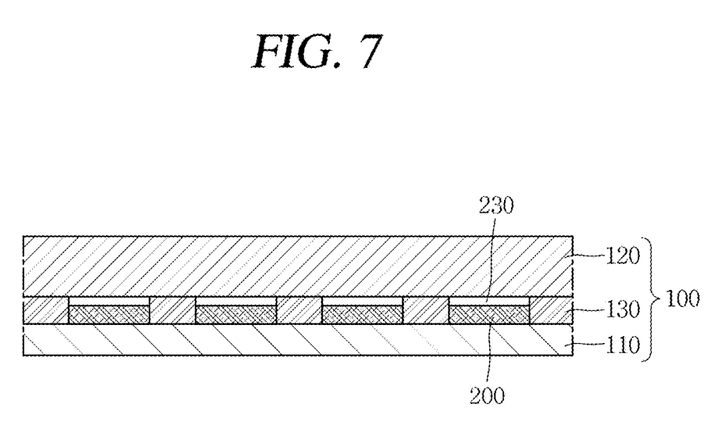
FIG. 7 is a cross-sectional view illustrating a heat exchanger according to a third exemplary embodiment of the present invention.
Figure 8:
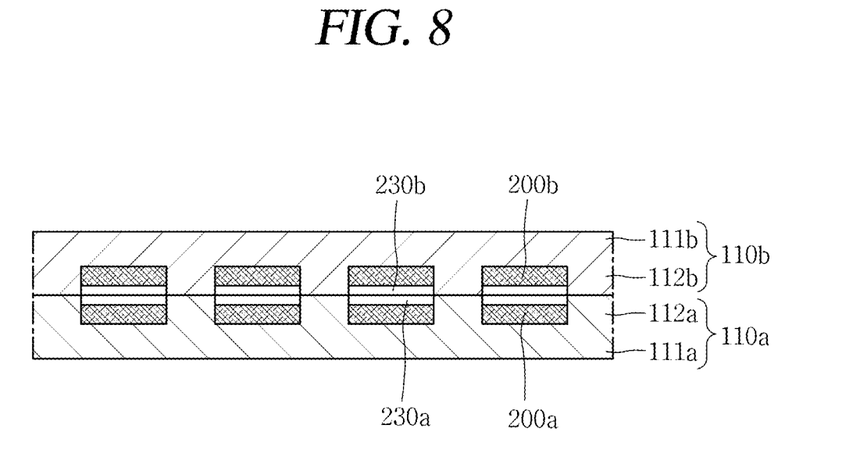
FIG. 8 is a cross-sectional view illustrating a heat exchanger according to a fourth exemplary embodiment of the present invention.

FIG. 2 is a cross-sectional view cut along A-A' of FIG. 1 as a cross-sectional view illustrating a heat exchanger according to a first exemplary embodiment of the present invention. FIG. 3 is a cross-sectional view cut along B-B' of FIG. 1 as a cross-sectional view illustrating the heat exchanger according to the first exemplary embodiment of the present invention. FIG. 4 is a magnified photograph illustrating a second layer including a plurality of needle-shaped particles. FIG. 5 is a view illustrating current waveforms used when wicks are formed in the present invention. FIG. 6 is a cross-sectional view illustrating a heat exchanger according to a second exemplary embodiment of the present invention. FIG. 7 is a cross-sectional view illustrating a heat exchanger according to a third exemplary embodiment of the present invention. FIG. 8 is a cross-sectional view illustrating a heat exchanger according to a fourth exemplary embodiment of the present invention.

Referring to FIGS. 1 to 3, the heat exchanger according to exemplary embodiments of the present invention includes a cylinder-shaped body 100 having a plate shape and an inner space in which a working fluid is vaporized or condensed, and thus capable of flowing; and a wick disposed within the body 100 and including a plurality of needle-shaped particles, in which the working fluid flows among the plurality of needle-shaped particles. Here, the inside of the body 100 is divided into a plurality of spaces by a plurality of guide blocks 112 to be described below, and a wick is formed or provided in each of the plurality of divided spaces.

Further, one end within the body 100 of the heat exchanger is an evaporating part which serves as an evaporator, the other end is a condensing part which serves as a condenser, and the middle serves as a channel through which a working fluid flows or moves from the evaporating part to the condensing part, or from the condensing part to the evaporating part. At this time, the evaporating part and the condensing part are determined according to the position of a device or product in which the heat exchanger is installed, and the working fluid flows from the evaporating part to the condensing part or from the condensing part to the evaporating part through a flow channel 230 which is a space among a plurality of needle-shaped particles or a space provided on one side of the needle-shaped particles.

As illustrated in FIGS. 1 to 3, the heat exchanger according to the first exemplary embodiment includes a base 110 having a plurality of grooves, a wick 200 formed at each of the plurality of grooves provided on the base 110, and a cover 120 which is disposed on the base 110, and thus covers the base 110 and the wick 200. The plurality of grooves provided on the base 110 is a space in which the wick 200 is formed, and one side, that is, a direction in which the cover 120 is disposed has an open shape. More specifically, the groove 200 provided on the base 110 has a shape in which the upper side thereof is open, and is formed so as to have the same size as a wick 200, or a larger volume than the wick 200.

When the base 110 according to the first exemplary is more specifically described, the base 110 includes a base member 111 having a plate shape, and a plurality of guide blocks 112 disposed so as to be spaced apart from each other on the upper surface of the base member 111. For the convenience of explanation, the base 110 has been explained by dividing a base member 111 and a plurality of guide blocks 112, but the base member 111 and the plurality of guide blocks 112 are an integrated type. That is, in the first exemplary embodiment, a plurality of grooves, which may accommodate the wick 200, is provided through a process of etching the base 110 itself, and the wall between the groove and the groove is a guide block 112.

The base member 111 is manufactured by using a metal, such that the wick 200 may be embodied in a plurality of wicks through an electroplating, and it is more preferred that the base member 111 is manufactured by using the same material as the wick. In the exemplary embodiments of the present invention, a base 110 including copper is provided in order to plate copper and form a wick 200 having a needle-shaped structure by using an electroplating method. More specifically, a base 110 is provided, in which the upper surface of a base at which the wick is to be at least formed is composed of copper.

The base member 111 and the cover 120 may have, for example, a plate shape whose cross-section is a square, as illustrated in FIG. 1. It is natural that the shapes of the base member 111 and the cover 120 are not limited to the above-described square, and may be variously changed according to a device in which the heat exchanger is to be installed, and the shape may be in the form of a plate having, for example, various polygonal or circular shapes.

The plurality of guide blocks 112 is disposed spaced apart from each other in a horizontal direction of the body 100 within the body 100, and a wick 200 is formed in a space between the guide block 112 and the guide block 112. More specifically, the plurality of guide blocks 112 is disposed in a space between the cover 120 and the base member 111, and is disposed spaced apart from the cover 120 in a horizontal direction of the base member 111. The guide block 112 may be in the form of a bar extending in a direction, and is manufactured by using a metal which allows the wick 200 to be formed by an electroplating, and it is more preferred that the guide block 112 is manufactured by using the same material as the wick 200. In the exemplary embodiments of the present invention, a guide block 112 using copper is provided in order to plate copper and form a wick 200 having a needle-shaped structure by using an electroplating method.

Each of the plurality of guide blocks 112 according to exemplary embodiments is formed so as to extend in a long-side direction of the base member 111, as illustrated in FIG. 1b, arranged in a short-side direction of the base member 111, and thus disposed spaced apart at equal intervals. However, the shape of the guide block 112 and the arranged direction and length and the like of the plurality of guide blocks 112 may be variously changed depending on the apparatus and product in which the heat exchanger according to the present invention is to be installed.

Again, returning to the body 100 of the heat exchanger, the body 100 according to the first exemplary embodiment as described above includes a base member 111, a plurality of guide blocks disposed spaced apart from each other on the upper surface of the base member 111, a base member 111, and a cover 120 covering a plurality of wicks 200 formed between the plurality of guide blocks 112 and the plurality of guide blocks, as illustrated in FIGS. 1 to 3. That is, the body 100 according to the first exemplary embodiment is provided with a plurality of grooves in which the wick 200 is formed on the base 110, and the plurality of grooves is divided by the guide block 112.

The wick 200 includes a plurality of needle-shaped particles, and thus, a working fluid flows among the plurality of needle-shaped particles, that is, into the pores. More specifically, the wick 200 is formed on a first layer 210 and a first layer 210, which are formed by the growth of grains on the upper surface of the base 110 as in the magnified view illustrated in FIG. 2, and includes a second layer 220 composed of a plurality of needle-shaped particles, as illustrated in FIG. 4. Here, the second layer 220 has a larger thickness than the first layer 210, and preferably, the second layer 220 has a thickness 10 to 30 times greater than the first layer.

The first layer 210 is an underlayer which creates easy conditions under which a second layer 220 having a plurality of needle-shaped particles is formed on the upper portion of the first layer 210. The first layer 210 is formed by an electroplating method, and uses a direct current waveform of current, which supplies direct current in a reverse direction (−) (see FIG. 5a). The second layer 220 is a form having a plurality of needle-shaped particles, is also formed by an electroplating method, and is formed by using a periodic reverse current plating (PR) or bipolar pulse current, which periodically changes the current direction, and thus, performs electroplating (see FIGS. 5b and 5c). At this time, the length of the long-side direction of a plurality of needle-shaped particles constituting the second layer 220 is 10 μm to 50 μm.

As described above, the second layer 220 according to exemplary embodiments of the present invention is composed of needle-shaped particles, more specifically, needle-shaped copper particles, and thus, has a larger porosity than a wick 200 with groove, mesh, or sintered form in the related art. Accordingly, since a working fluid flows within the wick 200 more smoothly than in the related art, there is an effect in that the heat exchange rate or the heat exchange performance is improved.

Further, in forming a wick 200 in the groove provided between the guide block 112 and the guide block 112, the wick 200 is formed so as to fill a portion of the groove 113 without filling the entire groove 113. For example, as in the magnified views illustrated in FIGS. 2 and 3, the height of the wick 200 is lower than that of the guide block 112 in a vertical direction, the lower surface of the wick 200 is brought into contact with the base member 111, the upper surface of the wick 200 is formed so as to be spaced apart from the cover 120, and thus, the wick 200 may be formed so as to provide an empty space between the upper surface of the wick 200 and the lower surface of the cover 120. When an explanation is given based on the groove provided between the guide block 112 and the guide block 112, the height of the wick 200 is formed so as to be lower than that of the groove in a vertical direction, and thus, the wick 200 may be formed such that the space on the upper side of the groove becomes an empty space. Here, the empty space between the wick 200 and the cover 120 or the empty space on the upper side of the groove serves as a flow channel 230 through which the working fluid flows, and accordingly, there is an effect in that the flow of the working fluid becomes more active.

It is natural that the wick 200 may fill the groove 113 wholly or partially, and may form a groove on the cover 120. For example, the groove of the cover 120 makes the upper surface of the wick 200 spaced apart, and thus, may be formed so as to provide an empty space in the groove of the cover 120, and the empty space serves as a flow channel 230 through which the working fluid flows.

The configuration will be described below, but the guide block may have a configuration of a base 110 provided by etching the base 110 (see the first exemplary embodiment, and FIGS. 3 and 9), or a configuration of a cover 120 provided on the cover 120 (the second exemplary embodiment, and FIGS. 6 and 10), or a configuration provided separately from the base 110 and the cover 120 (the third exemplary embodiment, and FIGS. 7 and 11). When another explanation is given, the guide block may have a configuration provided on the base 110 itself (see the first exemplary embodiment, and FIGS. 3 and 9), provided on the cover 120 itself (the second exemplary embodiment, and FIGS. 6 and 10), or provided separately from the base 110 and the cover 120.

Hereinafter, for the convenience of explanation, a guide block provided on the base 110 is denoted as a reference numeral 112, a guide block provided on the cover 120 is denoted as a reference numeral 122, and a guide block provided separately from the base 110 and the cover 120 is denoted as a reference numeral 130.

The first exemplary embodiment described above through FIGS. 2 and 3 described that the wick 200 is formed so as to be accommodated in the groove provided on the base 110. However, the groove in which the wick 200 is accommodated may also be provided on the cover 120 without being limited thereto.

When explained referring to FIG. 6, the wick 200 of the heat exchanger according to the second exemplary embodiment includes a base 110 and a cover 120 disposed on the upper side of the base 110 and having a groove in which a plurality of wicks 200 formed on the base 110 may be accommodated. Here, the groove provided on the cover 120 has a shape in which one side, that is, the lower side is open. That is, the cover 120 includes a cover member 121 having a plate shape, and a plurality of guide blocks 122 disposed so as to be spaced apart from each other on the lower surface of the cover member 121. For the convenience of explanation, the cover 120 has been explained by dividing the cover member 121 and the plurality of guide blocks 122, but the cover member 121 and the plurality of guide blocks 112 are an integrated type. That is, the cover 120 according to the second exemplary embodiment provides a plurality of grooves in which the wick 200 may be accommodated by processing the cover 120 itself by a processing process such as pressing, and a wall between the groove and the groove is a guide block 122.

At this time, the depth of the groove provided on the cover 120 is formed more deeply than the height of the wick 200. Accordingly, an empty space is provided between the wick 200 and the groove, thereby serving as a flow channel 230 through which a working fluid moves.

Furthermore, as illustrated in the third exemplary embodiment illustrated in FIG. 7, the guide block 130 may also be provided separately from the base 110 and the cover 120. The heat exchanger according to the third exemplary embodiment includes a base 110, a plurality of guide blocks 130 disposed spaced apart from each other on the upper surface of the base guide 110, a wick 200 formed in a plurality of spaces divided by the plurality of guide blocks 130, and a cover 120 installed so as to cover the plurality of guide blocks 130 and the upper portions of the plurality of the wicks 200. Here, it is preferred that the guide block 130 separately provided is composed of copper. At this time, the flow channel 230 may be provided by filling the wick 200 in some of a plurality of spaces divided by the guide block 130, or forming a groove on the cover 120.

As another example, without providing a separate cover 120 as in the fourth exemplary embodiment illustrated in FIG. 8, the configuration may be a structure in which two bases 110*a* and 110*b* accommodating the wick 200 therewithin are provided, and the wicks 200*a* and 200*b* are bound so as to be brought into contact with each other. More specifically, an upper base 110*b* includes an upper base member 111*b*, and a plurality of upper guide blocks 112*b* provided so as to be spaced apart from each other on the upper base member 111*b*, and an empty space between the plurality of upper guide blocks 112*b* is the groove. Further, a lower base 110*a* includes a lower base member 111*a*, and a plurality of lower guide blocks 112*a* provided so as to be spaced apart from each other on the lower base member 111*a*, and an empty space between the plurality of upper guide blocks 112*a* is the groove. Each groove of the lower and upper bases 110*a* and 110*b* is filled with the wicks 200*a* and 200*b*, the bases 110*a* and 110*b*, in which the wicks 200*a* and 200*b* are accommodated in the grooves, are joined in a vertical direction, and at this time, the upper base 110*a* and the lower base 110*b* are bound, such that the lower surface of the wick 200*a* accommodated in the upper base 110*a* and the upper surface of the wick 200*b* accommodated in the lower base 110*b* are brought into contact with each other. In forming the wicks 200*a* and 200*b* in the groove provided on the bases 110*a* and 110*b*, the wicks 200*a* and 200*b* may be formed, such that an empty space is provided on the upper side. Thereafter, when these are bound to each other, an empty space is provided between the wick 200*a* disposed at the lower portion and the wick 200*b* disposed at the upper portion, and the empty space is a flow channel 230*a* and 230*b* through which a working fluid moves.

It is natural that in forming the wicks 200*a* and 200*b* in a groove provided on the bases 110*a* and 110*b*, an empty space may also be provided only in any one of the wicks provided on the bases 110*a* and 110*b*. Thereafter, when these are bound to each other, an empty space is provided between the wick 200*a* disposed at the lower portion and the wick 200*b* disposed at the upper portion, thereby serving as a flow channel 230*a* and 230*b* through which a working fluid moves.

Figure 9:
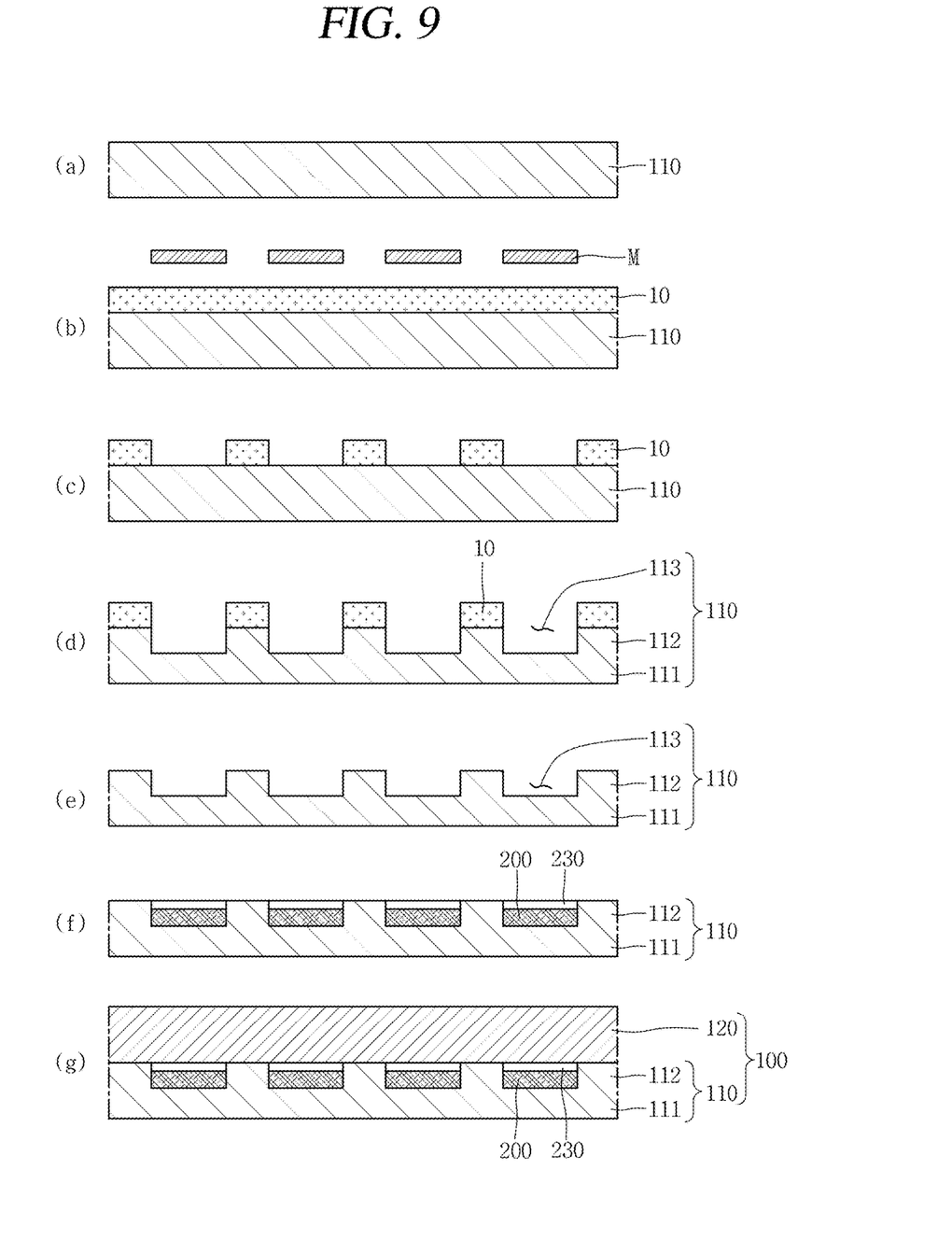
FIG. 9 is a view sequentially illustrating a method for manufacturing the heat exchanger according to the first exemplary embodiment of the present invention.
Figure 10:
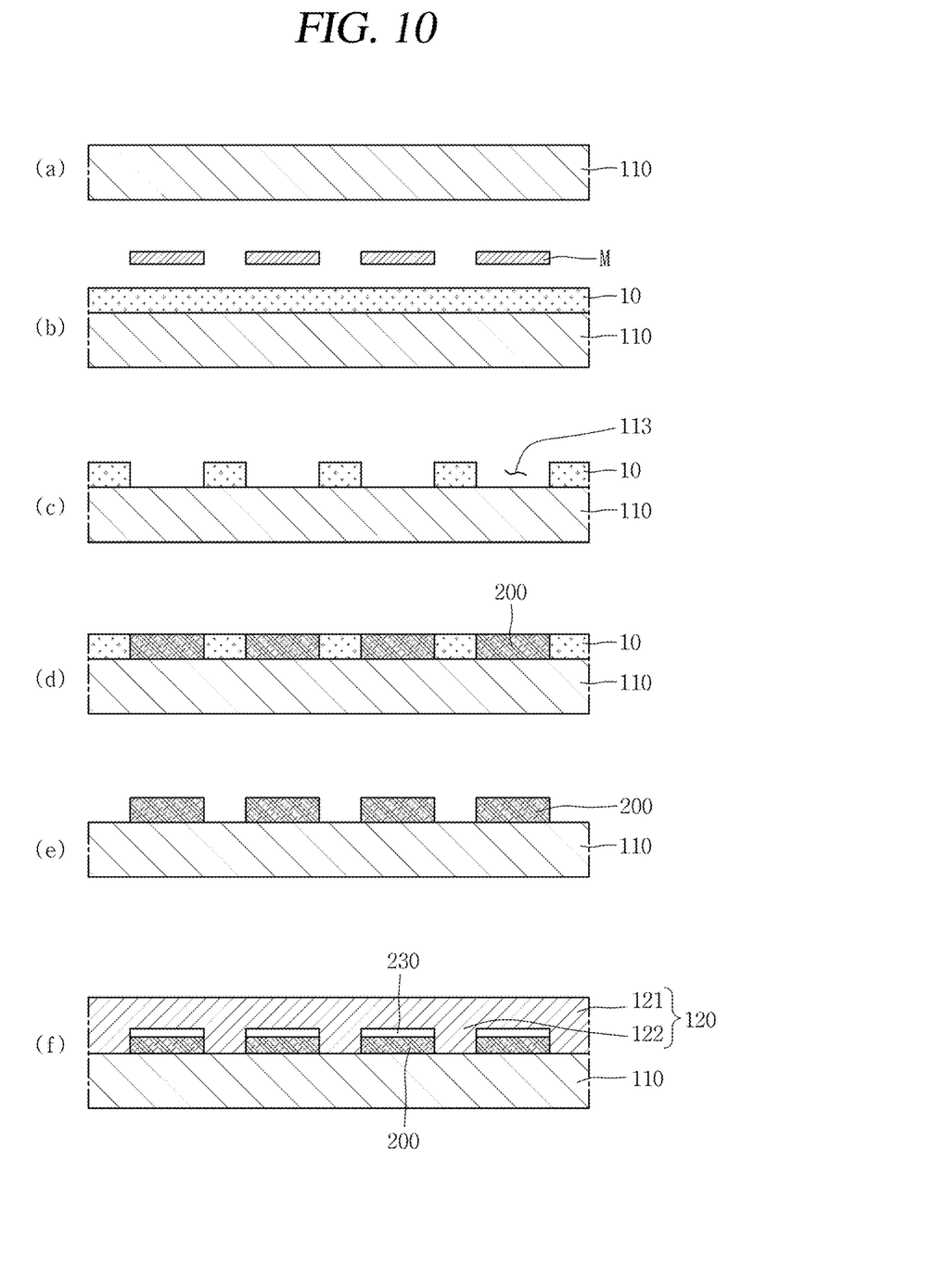
FIG. 10 is a view sequentially illustrating a method for manufacturing the heat exchanger according to the second exemplary embodiment of the present invention.

FIG. 9 is a view sequentially illustrating a method for manufacturing a heat exchanger according to a first exemplary embodiment of the present invention. FIG. 10 is a view sequentially illustrating a method for manufacturing a heat exchanger according to a second exemplary embodiment of the present invention. FIG. 11 is a view sequentially illustrating a method for manufacturing a heat exchanger according to a third exemplary embodiment of the present invention.

Hereinafter, the method for manufacturing a heat exchanger according to a first exemplary embodiment of the present invention will be described with reference to FIG. 9.

First, a mask pattern 10 is formed, such that a base 110 having a plate shape is provided by using copper (FIG. 9*a*), and a space in which a wick 200 is to be formed on the base 110 is secured (FIGS. 9*b* and 9*c*). For this purpose, first, as illustrated in FIG. 9*b*, a layer for forming a mask pattern 10 on the upper surface of the base 110 (hereinafter, referred to as a mask layer 11) is provided, and the mask layer 11 may be formed, for example, by applying a photoresist (PR) on the base 110. Moreover, an exposure process including: disposing the photo mask (M) on the upper side of the mask layer 11, and irradiating light, for example, UV on the upper side of the photo mask (M) is performed, and then the mask is developed. Thus, a mask pattern 10, from which the region of the mask layer 11 corresponding to the lower region of the photo mask (M) is removed as in FIG. 9*c*, is formed.

In the above, a photoresist (PR) is used as a raw material for forming the mask pattern 10, but a tape may also be used.

Thereafter, a base 110 on which the mask pattern 10 is formed is washed. For example, a degreasing solution is used to remove impurities present on the surface of the base 110, and 10% sulfuric acid is used to remove the oxidation film on the surface while neutralizing the base 110. In order to prevent the mask pattern 10 from deviating from the base 110 during the washing process, it is preferred to use an acidic solution as the degreasing solution.

Subsequently, when the base 110 in which the mask pattern 10 is formed on the upper surface thereof is subjected to an etching process, the region of the base 110, in which the mask pattern 10 is not formed as in FIG. 9, is etched, thereby providing a plurality of grooves 113. When the etching process is terminated, the mask pattern 10 is removed by performing a strip process (FIG. 9*e*). Accordingly, as illustrated in FIG. 9*e*, a base 110 having a plurality of grooves 113 formed spaced apart from each other is manufactured. When the explanation is again given, a base including a base member 111, a plurality of guide blocks 112 disposed spaced apart from each other on the upper surface of the base member 111, and a plurality of grooves 113 divided by the plurality of guide blocks 112 is manufactured.

Next, a wick 200 is formed in each of a plurality of grooves 113 provided on the base 110 as in FIG. 9f, a first layer 210 by the growth of grains is first formed by an electroplating method, and subsequently, a second layer 200 composed of a plurality of needle-shaped particles is formed. For this purpose, an electrolytic copper plating solution containing copper sulfate, sulfuric acid, chlorine, and other additives is provided, and a base composed of copper and a positive electrode plate are immersed in the plating solution. Thereafter, a first layer 210 is first formed in a groove 113 provided on the base 110 by applying a power supply to each of the base 110 and the positive electrode plate from a power supply part (not illustrated), and a direct waveform of current, which supplies a direct current having a certain size, is supplied. Accordingly, copper in the electrolytic copper plating solution is precipitated, and thus, grown from the bottom of the groove 113, and at this time, the first layer 210 is formed by the growth of grains (see the magnified view of FIG. 2), and is formed in a thickness of, for example, 2 μm to 3 μm. When the forming of the first layer 210 is terminated, a second layer 220 composed of a plurality of needle-shaped particles is formed on the first layer 210 by a periodic reverse (PR) current plating, which periodically changes the current direction, and thus, performs electroplating. That is, when a bipolar pulse wave current which periodically alternately supplies a forward direction current (+) and a reverse direction current (−) in the current direction is supplied, a copper precipitate crystal is plated on the first layer 210 and developed from the first crystals, and thus, a precipitate having a needle-like or dendritical shape is grown.

Meanwhile, in supplying a bipolar pulse wave current for forming the second layer 220, at least one of current with a waveform having an off time as in FIG. 5b and current having with a waveform having no off time as in FIG. 5c is used.

That is, when the current is converted from the forward direction to the reverse direction or from the reverse direction to the forward direction as in FIG. 5b, the second layer 220 is formed by supplying a bipolar pulse wave current having an off time in which current is not applied even to any polarity therebetween, or the second layer 220 is formed by supplying a bipolar pulse wave current having no off time as in FIG. 5c. Furthermore, a second layer 220 may also be formed by using both a bipolar pulse wave current (FIG. 5b) having an off time and a bipolar pulse wave current (FIG. 5c) having no off time.

Subsequently, the second layer 220 is fixed on the first layer 210 by supplying one polarity, that is, a unipolar pulse wave current which supplies the direct current in a pulse form in a reverse direction (−) (see FIG. 5d).

A wick 200, in which a first layer 210 and a second layer 220 are stacked, is formed in a plurality of grooves 113 provided on the base 110 by an electroplating method as described above. When a process of forming the wick 200 is terminated, a cover 120 is attached so as to cover the base and the upper portion of the wick 200 as in FIG. 9g.

Hereinafter, the method for manufacturing a heat exchanger according to a second exemplary embodiment of the present invention will be described with reference to FIG. 10. At this time, the descriptions overlapping with above-described method for manufacturing a heat exchanger according to the first exemplary embodiment will be omitted or simply described.

First, a base 110 having a plate shape is provided by using copper (FIG. 10a), and a mask pattern 10 is formed on the base 110 (FIGS. 10b and 10c). Thereafter, an acidic degreasing solution and a 10% sulfuric acid solution are used to wash the base 110 on which a mask pattern 10 is formed and remove an oxidation film.

When the washing of the base 110 is terminated, a first layer 210 and a second layer 220 are formed on a space 113 provided between the mask patterns 10, that is, the groove 113 by a copper electroplating method. At this time, as described above, the first layer 210 is formed by supplying a reverse direction (−) direct current having a certain size, and the second layer 220 is formed by supplying a bipolar pulse wave current which periodically alternately supplies a forward direction current and a reverse direction current. Thereafter, the first layer 210 is fixed on the second layer 220 by supplying a unipolar pulse wave current which supplies the reverse direction direct current in a pulse form. By such a copper electroplating process, a wick in which the first layer 210 and the second layer 220 are stacked is formed in a plurality of spaces 113 or grooves 113 on the upper portion of the base divided by the mask pattern 10 as described in FIG. 10d.

Next, a strip process is performed to remove the mask pattern 10 (FIG. 10e), and attach a cover 120 so as to cover the base 110 and the upper portions of a plurality of wicks 200. Here, the lower portion of the cover 120 has a shape in which a plurality of grooves accommodating a plurality of wicks 200 formed spaced apart from each other on the base 110 is provided.

Hereinafter, the method for manufacturing a heat exchanger according to a third exemplary embodiment of the present invention will be described with reference to FIG. 11. At this time, the descriptions overlapping with above-described method for manufacturing a heat exchanger according to the first and second exemplary embodiments will be omitted or simply described.

First, copper is used to provide a member (hereinafter, referred to as a guide member 131) for manufacturing a base having a plate shape and guide block 130, and attach the guide block 131 on a base 100. And then, a mask pattern 10 is formed on the guide member 131 (FIGS. 10b and 10c). Thereafter, an acidic degreasing solution and a 10% sulfuric acid solution are used to wash the base 111 on which the mask pattern 10 is formed and the guide member 131, and remove an oxidation film.

Figure 11:
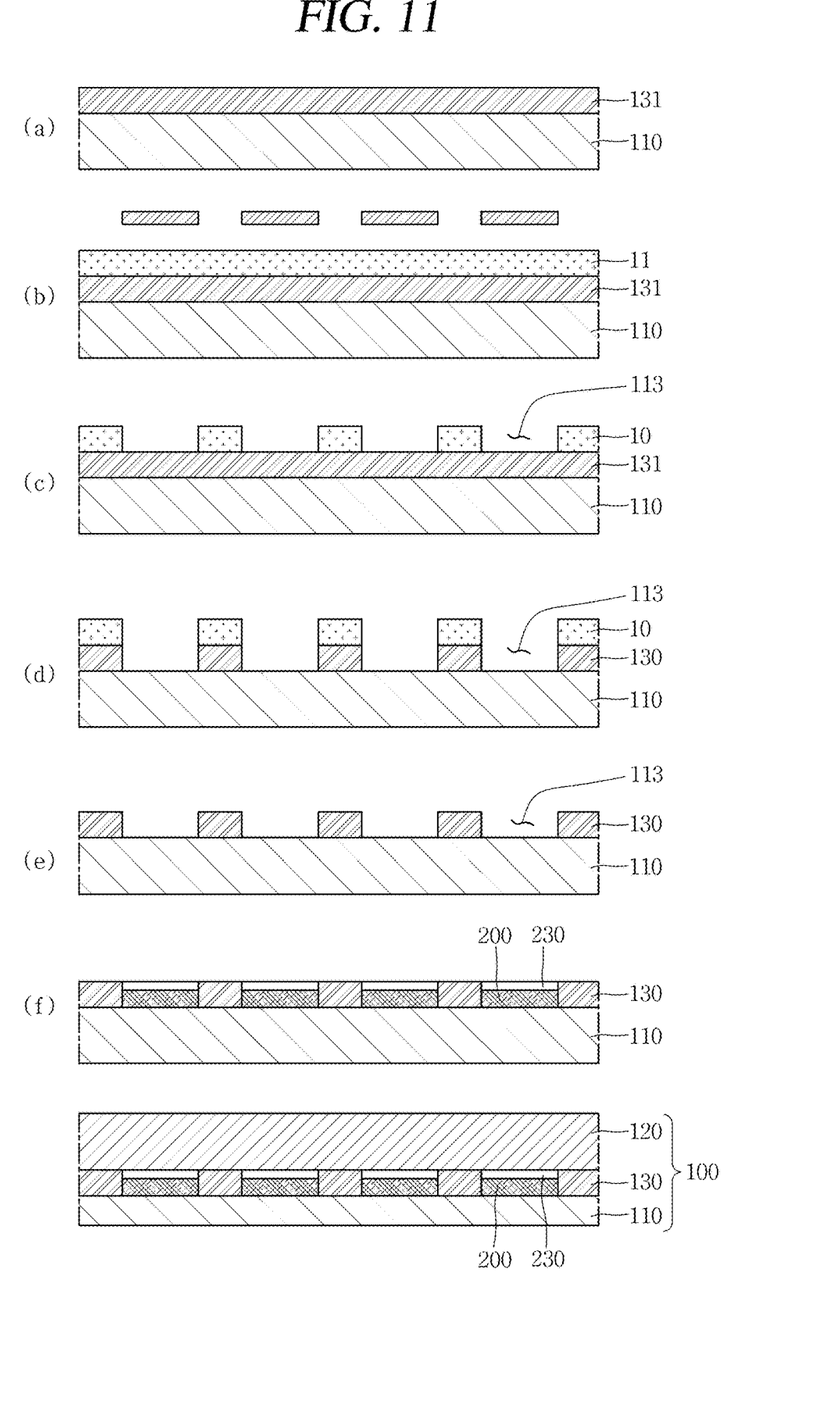
FIG. 11 is a view sequentially illustrating a method for manufacturing the heat exchanger according to the third exemplary embodiment of the present invention.

Subsequently, when the base 131 including the mask pattern formed on the upper surface thereof is subjected to an etching process, the region of the guide member 131, in which the mask pattern 10 is not formed as in FIG. 11d, is etched, thereby providing a plurality of grooves 113. When the etching process is terminated, the mask pattern 10 is removed by performing a strip process (FIG. 10e). Accordingly, as illustrated in FIG. 10e, guide blocks 130 disposed spaced apart from each other on the upper portion of the base 100 are formed, and a space between the plurality of guide blocks 130 is a space 113 or a groove 113, in which the wick 200 is to be subsequently formed.

Next, as in FIG. 11f, a wick 200 having a plurality of needle-shaped particles is formed on the upper portion of the base 100, and a first layer 210 and a second layer 220 are stacked in a space 113 or a groove 113 provided by the plurality of guide blocks 130 by the copper electroplating method.

Moreover, a cover 120 is attached so as to cover a plurality of guide blocks 130 and a plurality of wicks 200 (FIG. 11g).

Further, a flow channel 230 is not separately mentioned in the above-described first to third exemplary embodiments, but the flow channel 230 is formed by filling only a portion of the wick 200 or providing a groove on the cover 120.

The method for manufacturing the heat exchanger according to the fourth exemplary embodiment will not be illustrated, but the heat exchanger may be manufactured by a to f processes in the manufacturing method according to the first exemplary embodiment illustrated in FIG. 9. That is, two bases 110a and 110b, in which the wicks 200a and 200b are formed by the method according to the first exemplary embodiment illustrated in FIGS. 9a to 9e, are provided (see FIG. 8). Furthermore, the upper base 110b and the lower base 110a are joined with each other, and the lower surface of the wick 200b provided in the upper base 110b and the upper surface of the wick 200a provided in the lower base 110a are attached so as to be brought into contact with each other. At this time, the flow channels 230a and 230b are formed by filling only a portion of the wick 200b provided on the upper base 110b and the wick 200a provided on the lower base 110a, or filling only a portion of any one of the wick 200b provided on the upper base 110b and the wick 200a provided on the lower base 110a.

Further, the heat exchanger may be manufactured by a to f processes in the manufacturing method according to the third exemplary embodiment illustrated in FIG. 10 as another method for manufacturing the heat exchanger according to the fourth exemplary embodiment.

That is, by the method according to the second exemplary embodiment illustrated in FIGS. 10a to 10f, two bases in which the wicks 200a and 200b are formed are provided, and the wick 200b provided on the upper base 110b and the wick 200a provided on the lower 110a may be attached so as to be brought into contact with each other, thereby manufacturing the heat exchanger.

At this time, the guide block separately provided is bound between the upper base 110b and the lower base 110a, and an empty space to be formed between the wicks 200a and 200b serves as a flow channel 230a and 230b by allowing the height of the guide blocks 112b and 112a to be higher than the combined height of the wick 200b provided in the upper base 110b and the wick 200a provided in the lower base 110a.

In addition, in the guide block 112b and 112a provided between the upper base 110b and the lower base 110a, an empty space to be formed between the wick 200 and the wick 200 may serve as a flow channel 230 by removing wholly or partially the guide block 112b and 112a formed between the wick 200a and the wick 200.

As another method, the heat exchanger may be manufactured by each providing a base 110 on which a wick 200 is formed by the method according to the first exemplary embodiment illustrated in FIGS. 9a to 9e and a base 110 on which a wick 200 is formed by the method according to the second exemplary embodiment illustrated in FIGS. 10a to 10e, and attaching the wicks formed on each base 110 so as to be brought into contact with each other. At this time, a flow channel 230 may be formed by allowing the height of the guide block 112 to be higher than that of the wick 200.

In the heat exchanger according to exemplary embodiments of the present invention as described above, the porosity of the wick 200 may be improved by forming a wick 200 including needle-shaped particles, as compared to the conventional wick 200 with a groove, mesh or sintered form. Accordingly, since a working fluid flows within the wick 200 more smoothly than in the related art, the heat exchange rate or the heat exchange performance is improved.

Furthermore, there is an advantage in that a thin-type heat exchanger may be manufactured by manufacturing a body 100 having a plate shape, and a wick 200.

The invention claimed is:

1. A heat exchanger comprising:
a body having an inner space in which a working fluid is vaporized or condensed, and thus capable of flowing;
a wick disposed within the body and having a plurality of needle-shaped particles, wherein the working fluid flows among the plurality of needle-shaped particles; and
a plurality of guide blocks provided within the body, each guide block having a bar shape,
wherein the wick comprises:
a first layer formed on the body; and
a second layer formed on the first layer so that the first layer is between the second layer and the body, the second layer composed of the plurality of needle-shaped particles,
wherein the second layer has a greater thickness than the first layer,
wherein the plurality of guide blocks is disposed spaced apart from each other in a horizontal direction of the body,
wherein the body is divided into a plurality of spaces by the plurality of guide blocks and the wick is formed in each of the plurality of spaces between the plurality of guide blocks,
wherein the wick is made of copper, and
wherein the plurality of guide blocks is made of copper, the wick formed by electroplating.

2. The heat exchanger of claim 1, wherein the body comprises:
a base member having a plate shape; and
a cover member having a plate shape disposed on the base member and spaced apart from the base member,
wherein the plurality of guide blocks is disposed between the base member and the cover member.

3. The heat exchanger of claim 1, wherein the body comprises copper (Cu).

4. The heat exchanger of claim 1, wherein the first layer and the second layer comprise copper (Cu).

5. The heat exchanger of claim 1, wherein the second layer has a thickness of 10 to 30 times greater than the first layer.

6. The heat exchanger of claim 1, wherein a plurality of flow channels are formed between the guide blocks, and wherein the wick is in the flow channels.

7. The heat exchanger of claim 6, further comprising a cover contacting a top of the guide blocks to form a top of the flow channels.

8. The heat exchanger of claim 1, wherein the body has a base member and the guide blocks, and wherein the guide blocks are on a top surface of the base member.

9. The heat exchanger of claim 8, wherein the body is rectangular.

* * * * *